(12) United States Patent
Iniewski et al.

(10) Patent No.: US 6,407,412 B1
(45) Date of Patent: Jun. 18, 2002

(54) MOS VARACTOR STRUCTURE WITH ENGINEERED VOLTAGE CONTROL RANGE

(75) Inventors: Krzysztof Iniewski, Coquitlam; Sebastian Claudiusz Magierowski, Toronto, both of (CA)

(73) Assignee: PMC-Sierra Inc., Burnaby (CA)

( * ) Notice: Subject to any disclaimer, the term of this patent is extended or adjusted under 35 U.S.C. 154(b) by 0 days.

(21) Appl. No.: 09/523,592

(22) Filed: Mar. 10, 2000

(51) Int. Cl.[7] .................. H01L 27/108; H01L 27/01
(52) U.S. Cl. .................. 257/107; 257/312; 257/351
(58) Field of Search ..................... 257/312, 351, 257/107

(56) References Cited

U.S. PATENT DOCUMENTS

| 5,159,426 A | * | 10/1992 | Harrington, III | 357/42 |
| 5,864,158 A | * | 1/1999 | Liu et al. | 257/330 |
| 6,100,770 A | * | 8/2000 | Litwin et al. | 331/117 |
| 6,211,745 B1 | * | 4/2001 | Mucke et al. | 331/117 |
| 6,218,703 B1 | * | 4/2001 | Sano | 257/347 |
| 6,268,778 B1 | * | 7/2001 | Mucke et al. | 331/117 |

* cited by examiner

Primary Examiner—Eddie Lee
Assistant Examiner—Joseph Nguyen
(74) Attorney, Agent, or Firm—Harold C. Baker; Robert A. Wilkes; Robert G. Hendry

(57) ABSTRACT

The present invention relates to a metal oxide semiconductor (MOS) varactor that takes advantage of the beneficial characteristics of MOS varactors to provide a high maximum to minimum capacitance ratio. By coupling in parallel at least one pair of MOS varactors with similar but shifted capacitance voltage (C-V) curves, the resulting capacitance is generally linear while preserving the desirable large capacitance ratio. A pair of MOS varactors, one with a p+ type gate and one with a n+ doped gate connected in parallel approximates the desired result. However, by adding further varactor elements, with their threshold voltages shifted by either implanting specific properties in their bodies or by providing offset voltages, a more linear C-V curve is attained while preserving the desired capacitance ratio.

13 Claims, 6 Drawing Sheets

MOS VARACTOR STRUCTURE WITH ENGINEERED VOLTAGE CONTROL RANGE

FIELD OF THE INVENTION

The invention relates to semiconductor devices and specifically to a varactor implemented using metal-oxide semiconductors.

BACKGROUND OF THE INVENTION

A varactor is, essentially, a variable voltage capacitor. The capacitance of a varactor, when within its operating parameters, decreases as a voltage applied to the device increases. Such a device is useful in the design and construction of oscillator circuits now commonly used for, among other things, communications devices.

Of the various types of oscillator circuits currently in use, the so called LC oscillator offers the best combination of high-speed operation low-noise performance, and low power consumption. The operating frequency of an LC oscillator is normally controlled or tuned by varying the voltage across the terminals of a varactor. For such an application, a varactor should ideally have a high maximum to minimum capacitance ratio. This is because the capacitance range of a varactor, the difference between its maximum capacitance and its minimum capacitance over the full sweep of its control voltage, is proportional to the attainable tuning range of the oscillator. Thus, a large capacitance range means a much larger attainable tuning range of the oscillator. Such a wide tuning range allows the communication device using the oscillator to be more robust over a wide variation of components, temperatures, and processes.

Also ideal for a varactor is a large voltage control range. The varactor's change in capacitance should occur over a large voltage range. Such a property allows the LC oscillator to be more immune to noise or small fluctuations in the control voltage.

A third desirable characteristic for a varactor is a linear voltage control range. The mathematical relation between a varactor's input voltage and its capacitance should ideally be as linear as possible. In other words, a varactor's capacitance-voltage reaction should be monotonic without gross non-linearity. By making the capacitance voltage characteristics as linear as possible, this reduces the AM to PM noise conversion in the LC oscillator in which the varactor is used. Not only that, but such a linearity also assists in maintaining the stability of a phase locked loop (PLL) in which the LC oscillator may be used.

Typically two varactor structures are used: the PN-junction varactor and the MOS varactor. Currently the PN-junction varactor is predominantly used in LC oscillators. Both these structures can be implemented using standard CMOS processes. The main drawback of the PN junction varactor is a low maximum to minimum capacitance ratio. This ratio is reduced further in deep submicron processes due to the higher doping levels needed in source/drain and well areas. The MOS varactor does not suffer on this account, with a high maximum to minimum capacitance ratio of roughly four to one for a typical 0.25 $\mu$m CMOS process. Furthermore, the MOS varactor's ratio increases in deep submicron processes due to the thinner gate oxide used. However, the MOS varactor's transition from maximum to minimum capacitance is abrupt. This gives a MOS varactor a small, highly non-linear voltage control range.

What is therefore required is a varactor that has the advantages of a MOS varactor and without its drawbacks. Accordingly, what is sought is a varactor with a large maximum to minimum capacitance ratio and a large, generally linear voltage control range.

SUMMARY OF THE INVENTION

The present invention relates to a metal oxide semiconductor (MOS) varactor that takes advantage of the beneficial characteristics of MOS varactors to provide a high maximum to minimum capacitance ratio. By coupling in parallel at least one pair of MOS varactors with similar but shifted capacitance voltage (C-V) curves, the resulting capacitance is generally more linear while preserving the desirable large capacitance ratio. A pair of MOS varactors, one with a p+ type gate and one with a n+ doped gate connected in parallel approximates the desired result. However, by adding further varactor elements, with their threshold voltages shifted by either implanting specific properties in their bodies or by providing offset voltages, a more linear C-V curve is attained while preserving the desired capacitance ratio.

Accordingly, in one embodiment, the present invention provides a varactor comprising a varactor element pair, the element pair comprising a p gate varactor element and an n gate varactor element coupled in parallel, each varactor element having a structure chosen from the group comprising:

a) a body constructed out of a p type substrate; an n well implanted in the body; a gate contact; a gate insulator coupled between the gate contact and the body and electronically isolating the body from the gate contact; and two n+ regions of the body doped with n type impurities, said two regions being positioned on opposite sides of the gate insulator; and b) a body constructed out of an n type substrate; a p well implanted in the body; a gate contact; a gate insulator coupled between the gate contact and the body and electronically isolating the body from the gate contact and two p+ regions of the body doped with p type impurities, said two regions being positioned on opposite sides of the gate insulator wherein the p gate varactor element has a p type gate contact constructed to have p type properties, the n gate varactor element has an n type gate contact constructed to have n type properties, all n+ regions or p+ regions of both p and n gate varactor elements are coupled together to at least one voltage source, and all gate contacts of both n gate and p gate varactor elements are coupled together to an output and the voltage source is coupled to ground.

Another embodiment the present invention provides a varactor comprising a plurality of varactor elements coupled in parallel between an output and a voltage source, each of said plurality of varactor elements being chosen from a group comprising, a p varactor element having a p type gate and an n varactor element having an n type gate; each varactor having a body constructed of a p type substrate and having at least two n+ doped regions and a gate insulator electronically isolating the gate from the body wherein each gate is coupled to the output, each n+ region is coupled to the voltage source and the voltage source is coupled to ground.

Yet another embodiment of the present invention provides a method of extending a voltage control range of a varactor while maintaining a high maximum to minimum capacitance ratio of the varactor, the method comprising coupling in parallel at least one pair of varactor elements comprising, an n varactor element having an n+ doped gate, a p varactor element having a p+ doped gate, said gates being coupled to an output and n+ doped regions of bodies, said gates being coupled to a voltage source.

BRIEF DESCRIPTION OF THE DRAWINGS

A better understanding of the invention will be obtained by considering the detailed description below, with reference to the following drawings in which.

DETAILED DESCRIPTION OF THE INVENTION

Figure 1:
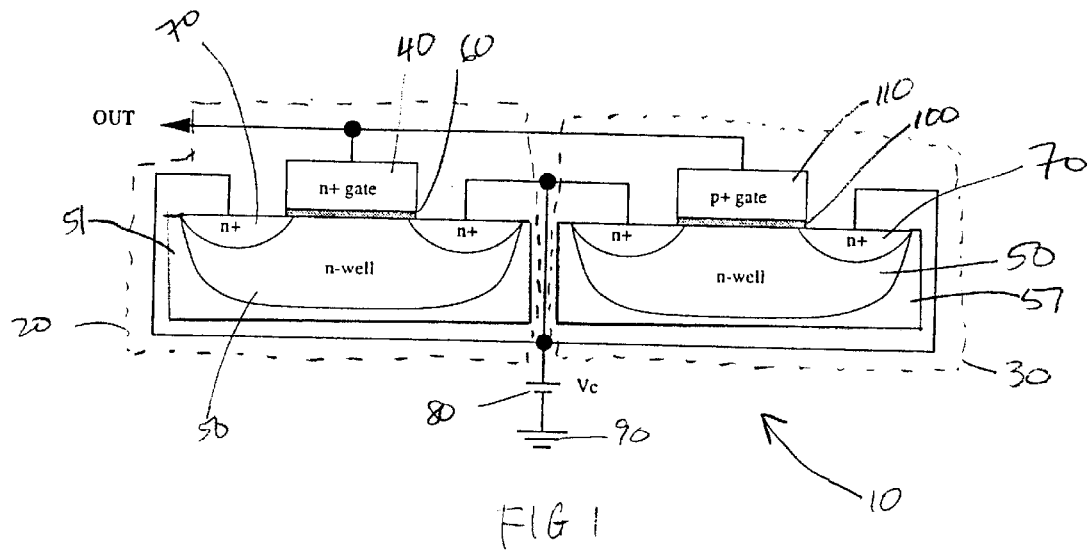
FIG. 1 is a side cross-sectional view of an embodiment of the invention showing the structure of the varactor elements.

Referring to FIG. 1, a varactor pair 10 according to the invention is illustrated. The varactor pair 10 is comprised of two varactor elements 20, 30. Varactor element 20 is an n gate varactor element with an n+ doped gate contact 40 isolated from an n-well 50 by an n gate insulation 60. The n-well 50 has regions 70 which are n+ doped. The n-well 50 is implanted in a p type substrate or body 51. The n+ doped regions 70 are both coupled to a voltage source 80 which is, in turn, coupled to ground 90.

The varactor element 30 is p gate varactor element with a structure generally similar to that of the varactor element 20.

The varactor element 30 also has, similar to varactor 20, an n-well 50 and n+ doped regions 70. Varactor element 30 also has an n gate insulator 100 which electrically isolates the body 50 from a p+ type gate contact 110.

The construction of the varactor elements 20 and 30 are generally similar except for the gate contacts 40 and 110. The gate contacts, 40, 110 are both coupled to the output OUT while all the n+ doped regions 70 are coupled together to the voltage source 80.

Figure 2:
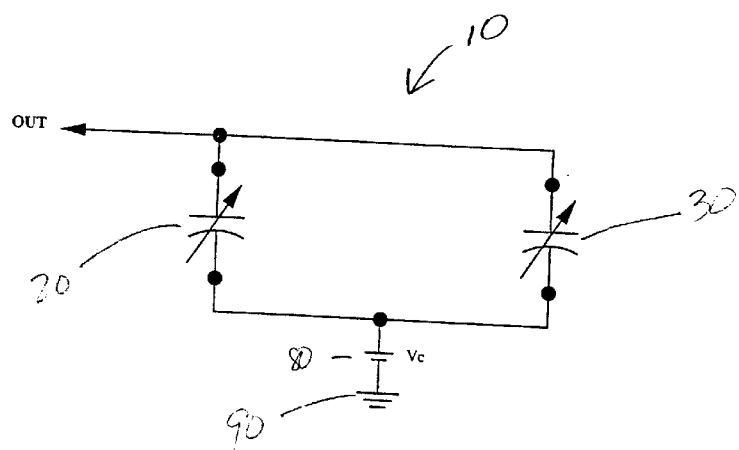
FIG. 2 is a schematic representation of FIG. 1.

Referring to FIG. 2, a schematic diagram shows the general interconnections and circuit equivalents of FIG. 1. The varactor 10 is essentially two varactor elements 20, 30 which are coupled in parallel and which are further coupled to a voltage source 80.

Figure 3:
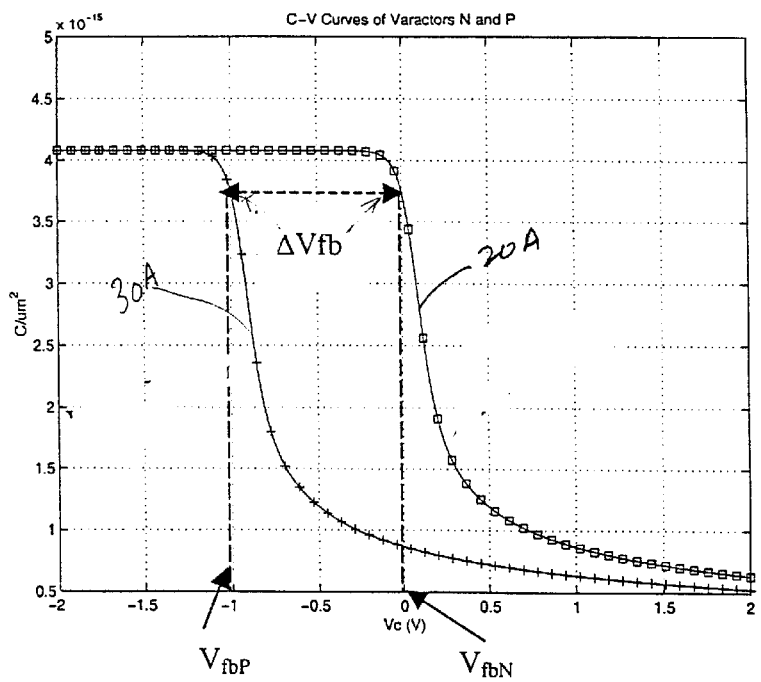
FIG. 3 is a plot of the individual C-V curves of the varactor elements in FIG. 1.

The capacitance-voltage characteristics (C-V curves) of varactor elements 20, 30 are illustrated in FIG. 3. In this figure, curve 30A corresponds to the C-V curve for varactor element 30 and curve 20A corresponds to the C-V curve for varactor element 20. As shown, the C-V curves of each of the varactor elements are identical but shifted in voltage. This is accomplished because the n+ and p+ gates (respectively 40, 110) have different contact potentials, $\phi_{MS}$ to the n-well 50. The shift can be related by the difference in flatband voltage, $V_{fb}$ (as indicated in FIG. 3) of the two structures. The expressions for the flatband voltages $V_{fbN}$ and $V_{fbP}$ of varactors 20 and 30, respectively are $$V_{fbN} = \phi_{MSN} - \frac{Q_f}{C_{ox}} + V_{tadjN} \qquad \text{Eqn. 1}$$

and $$V_{fbP} = \phi_{MSP} - \frac{Q_f}{C_{ox}} + V_{tadjP} \qquad \text{Eqn. 2}$$

where $C_{ox}$ is the gate-oxide capacitance, $Q_f$ is the fixed oxide charge while $V_{tadjP}$ and $V_{tadjN}$ are threshold adjust implant offsets. For high gate-doping concentrations the contact potentials $\phi_{MSN}$ (for Varactor N and $\phi_{MSP}$ (for Varactor P) are −50 mV and 1.1 V, respectively. Hence, assuming that $V_{tadjP}$ and $V_{tadjN}$ are equal to zero then $\Delta V_{fb} = V_{fbP} - V_{fbN}$ 32 1.15V. The shift between C-V curves is equal to $\Delta V_{fb}$ as shown in FIG. 3.

Figure 4:
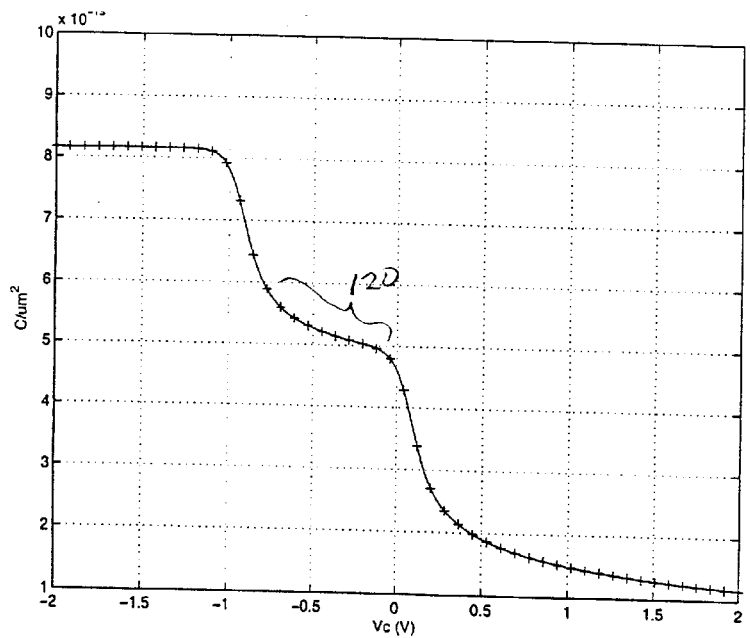
FIG. 4 is a plot of the combined C-V curve of the varactor elements in FIG. 1.

The total capacitance seen by the output OUT is plotted in FIG. 4. FIG. 4 shows the sum of the C-V curves for varactor elements 20, 30 and, as can be seen, this sum has a larger voltage control range than either varactor element separately.

However, as can be seen in FIG. 4, there is a capacitance plateau in the middle of the C-V curve. This plateau 120 stretches over 700 mV and may cause some problems with a PLL circuit. A PLL circuit may become unstable and more noise may be introduced into the oscillator by the AM-to-PM conversion.

Figure 5:
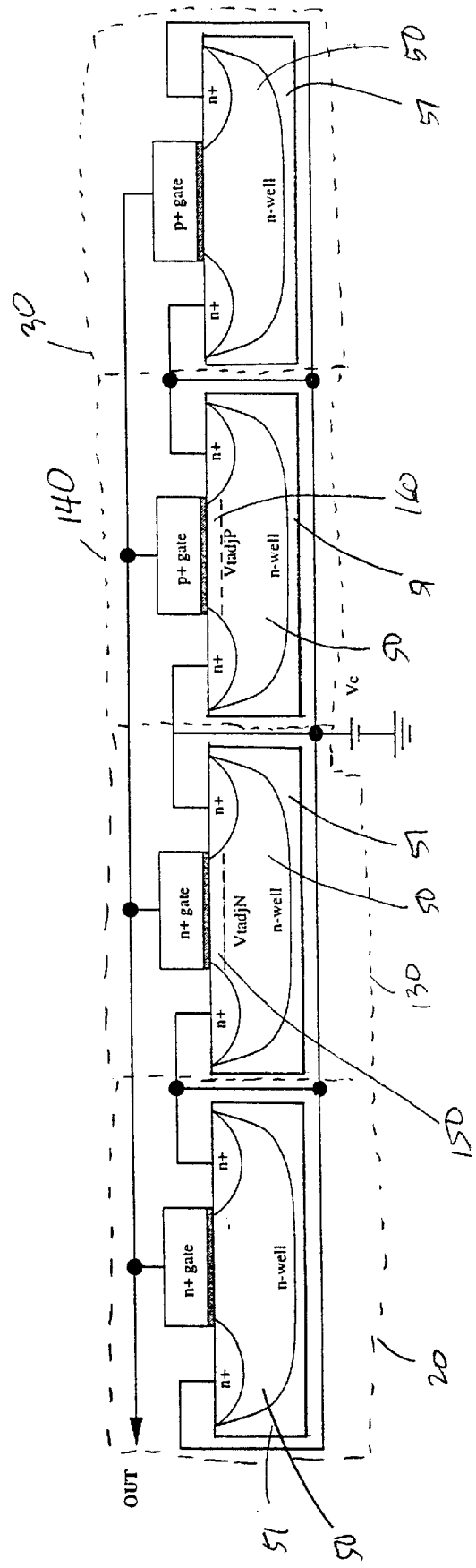
FIG. 5 is a cross sectional view of an embodiment of the invention using four varactor elements.

A solution to this potential problem is pictured in FIG. 5. Varactor elements 20 and 30 are still coupled in parallel but two new threshold adjusted varactor elements 130, 140 have also been coupled in parallel.

Threshold adjusted varactor elements 130, 140 are similar in structure to varactor elements 20, 30. However, while threshold adjusted varactor element 130 is essentially an n gate varactor element, there is an important difference. Threshold adjusted varactor element 130 is a threshold adjust n gate varactor element having a threshold adjust implant 150 implanted into its n-well 50.

Correspondingly, threshold adjusted varactor element 140 is similar to p gate varactor element except that the threshold adjusted varactor element 140 is a threshold adjusted p gate varactor element having a threshold adjust implant 160 implanted into its n-well 50.

Figure 6:
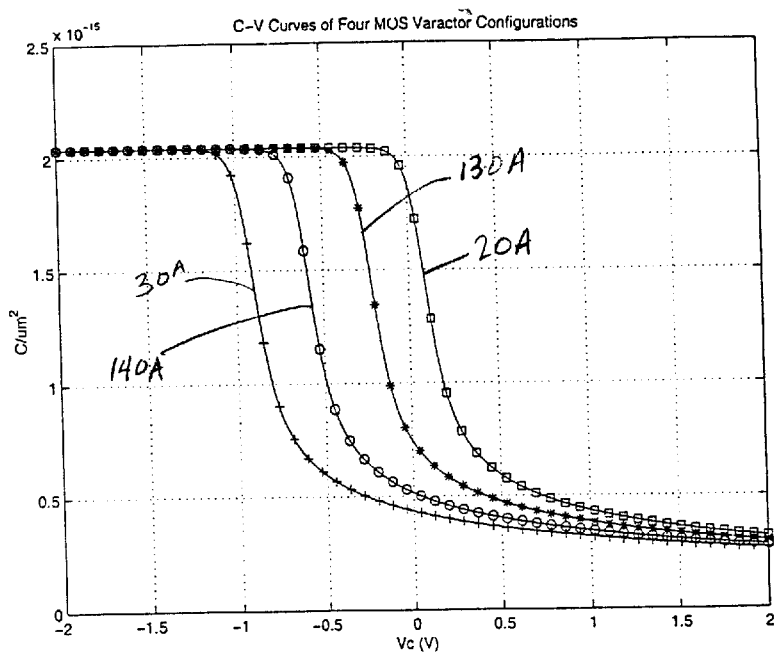
FIG. 6 is a plot of the individual C-V curves of the varactor elements of FIG. 5.
Figure 7:
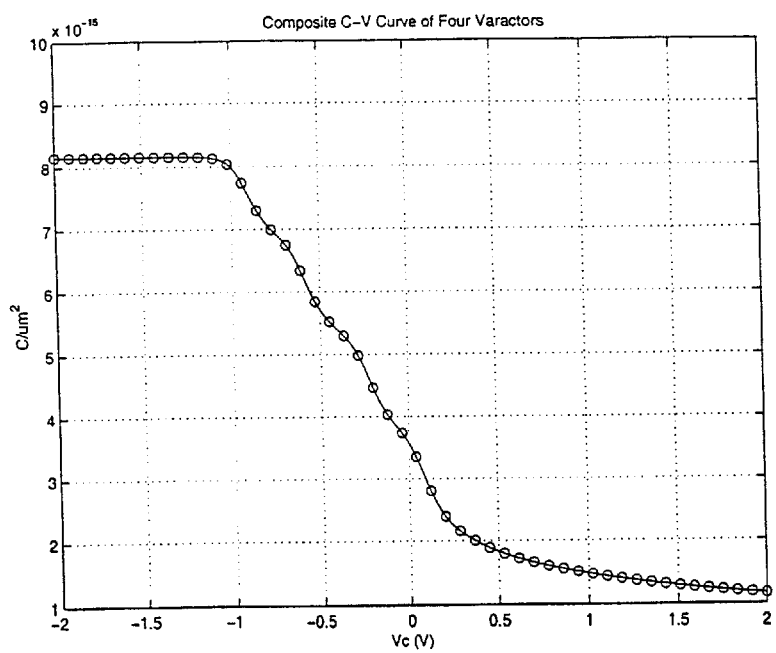
FIG. 7 is a composite C-V curve of the four varactor elements of FIG. 6.

The C-V curves of each of the four structures are shown overlaid in FIG. 6. Curves 20A and 30A correspond to varactor elements 20 and 30. Curves 130A and 140A correspond to varactor elements 130 and 140. The equivalent capacitance of this structure, the sum of the curves 20A, 30A, 130A, 140A, is shown in FIG. 7. Thus, the maximum to minimum capacitance ratio is maintained while that voltage control range is made more linear. Correct placing of the two additional curves can approximate an inverse-parabolic capacitance voltage dependence.

The complication is that the C-V source shift needed for the two new structures cannot be obtained as easily as just using different gate materials. Instead, alongside the change in gate material the channel doping of the two threshold adjusted elements must be altered; this is done with a threshold-adjust implant. The dashed lines in FIG. 5 represent the change in channel characteristics due to the threshold adjust implant 150, 160. The effect of these implants on the relative positions of the C-V curves is expressed by the variables $V_{tadjN}$ and $V_{tadjP}$ in Eqn. 1 and Eqn. 2. Thus, in order to attain the composite curve of FIG. 7, $V_{tadjN}$ must be an n type implant (e.g. phosphorous) such that the characteristics of the threshold adjusted varactor element 130 are the same as that for varactor element 20 with a shift in the C-V curve to the left of 300 mV. $V_{tadjP}$ must be a p type implant (e.g. boron or $BF_2$) such that the characteristics of the threshold adjusted varactor element 140 is the same as that for the varactor element 30 with a shift in the C-V curve to the right of 300 mV.

Figure 8:
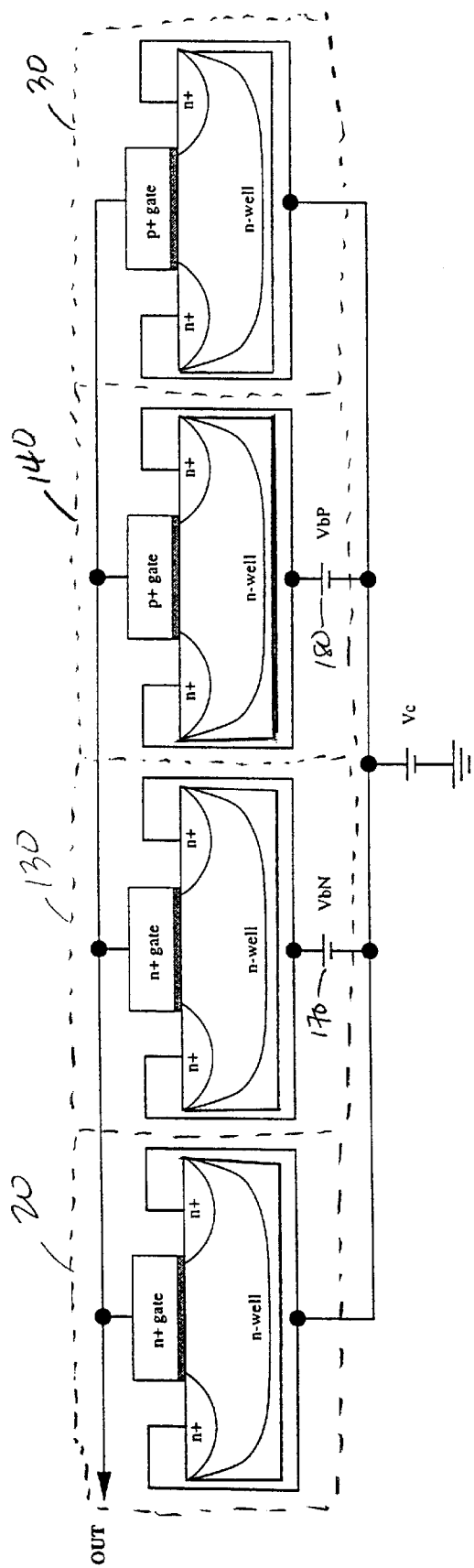
FIG. 8 is a cross sectional view of an alternative embodiment of the configuration of FIG. 5.

However, the structure illustrated in FIG. 5 is not the only one possible for adjusting the threshold of the varactor's. FIG. 8 shows an alternative embodiment of the varactor 10.

As can be seen in FIG. 8, channel implants are not used on threshold adjusted varactor elements 130, 140. Instead, an n voltage source 170 and a p voltage source 180 are used. N voltage source 170 and p voltage source 180 are used to shift the C-V curves of threshold adjusted varactor elements 130, and 140 respectively. By judiciously choosing the values for the voltage sources 170, 180, the effect provided by the implants 150, 160 can be achieved. This approach avoids the complexity of introducing various implants and offers more flexibility in selecting the voltage range and linearity.

Figure 9:
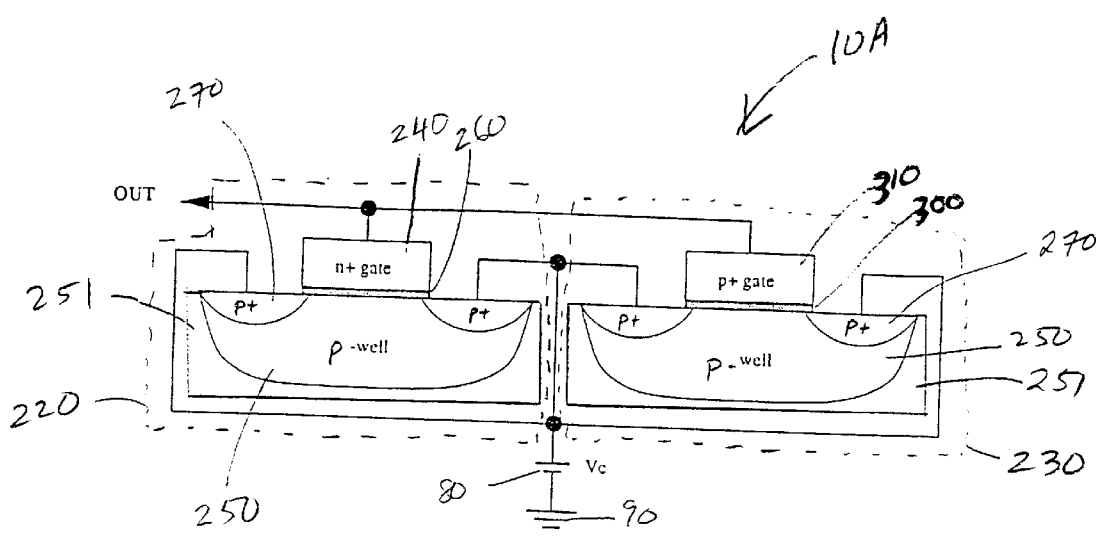
FIG. 9 is an alternative embodiment of the varactor illustrated in FIG. 1.

It should be noted that while structures described above apply to an embodiment having a body constructed out of a p type substrate, an n type substrate implementation is also possible. FIG. 9 illustrates an n type substrate implementation of the varactor pair 10 shown in FIG. 1.

FIG. 9 is an illustration of a varactor pair 10A comprising two varactor elements 220, 230. Varactor element 220 is an n gate varactor element with an n+ doped gate contact 240 isolated from a p well 250 by an n gate insulation 260. The p well 250 has regions 270 which are p+ doped. The p well 250 is implanted in an n type substrate or body 251. The p+ doped regions 270 are both coupled to a voltage source 80 which is, in turn coupled to ground 90.

Varactor element 230 is a p gate varactor element with a structure generally similar to that of the varactor element 220.

Similar to varactor element 220, varactor element 230 has a p well 250 having p+ doped regions 270. The gate insulator 300 isolates the p well 250 from a p+ doped gate contact 310.

The structure illustrated in FIG. 9 can be used in much the same way as the structure pictured in FIG. 1.

Regarding fabrication of the varactor elements, fabricating MOS transistors with n+ and p+ gates (for the NMOS and PMOS devices, respectively) is already a common practice in deep sub-micron processes. Extending this to MOS varactors is not a significant engineering effort. Similarly, the use of threshold adjust implants is common in MOS processing. In particular, in deep submicron CMOS, special masks to block threshold adjust implant are used to produce devices with different threshold voltages.

The person understanding the above described invention may now conceive of alternative design, using the principles described herein. All such designs which fall within the scope of the claims appended hereto are considered to be part of the present invention.

The embodiments of the invention in which an exclusive property or privilege is claimed are defined as follows:

1. A compound varactor comprising a varactor element pair having:
   a p gate varactor element and an n gate varactor element coupled in parallel between an output and ground;
   each varactor element having:
      a body constructed out of a first conductivity type substrate;
      a well of opposite conductivity type implanted in the body;
      a gate contact;
      a gate insulator coupled between the gate contact and the body and electronically isolating the body from the gate contact; and
      two regions of the body doped with said opposite conductivity type impurities, said two regions being positioned on opposite sides of the gate insulator;
   the p gate varactor element has a p type gate contact constructed to have p type properties;
   the n gate varactor element has an n type gate contact constructed to have n type properties;
   said two regions of both p gate and n gate varactor elements are connected to a voltage source;
   the gate contacts of both n gate and p gate varactor elements are connected to an output; and
   the voltage source is connected to ground.

2. A varactor as claimed in claim 1 including a second varactor element pair coupled in parallel to a first varactor element pair, the second varactor element pair comprising a threshold adjusted p gate varactor element and a threshold adjusted n gate varactor element coupled in parallel; wherein
   said threshold adjusted p varactor element is a p gate varactor element as defined in claim 1 further including a p type implant in the well to adjust the threshold voltage of the threshold adjusted p gate varactor element;
   the threshold adjusted n gate varactor element is an n gate varactor element as defined in claim 1 further including an n type implant in the well to adjust a threshold voltage of the threshold adjusted n gate varactor element;
   all said two regions are connected to a voltage source;
   all gate contacts are coupled together to the output; and
   the voltage source is connected to ground.

3. A varactor as claimed in claim 2 wherein the p-type implant is selected from the group comprising boron and $BF_2$, and the n type implant is phosphorous.

4. A varactor comprising:
   a plurality of varactor elements coupled in parallel between an output and a voltage source, each of said plurality of varactor elements being chosen from a group comprising:
   a p gate varactor element having a p type gate; and
   an n gate varactor element having an n type gate; each varactor element having:
   a body constructed from a substrate chosen from the group comprising:
      a p type substrate having an n-well implanted in the p type substrate, the n-well having at least two n+ doped regions; and
      an n type substrate having a p-well implanted in the n type substrate, the p-well having at least two p+ doped regions;
   gate insulators electronically isolating the gates from the wells;
   each gate being connected to the output;
   each doped region being connected to the voltage source; and
   the voltage source being connected to ground.

5. A varactor as claimed in claim 4 wherein the number of p gate varactor elements is equal to the number of n gate varactor elements.

6. A varactor as claimed in claim 5 wherein the plurality of varactor elements includes threshold adjusted elements chosen from the group comprising:
   a threshold adjusted p gate varactor element having a p type gate; and
   a threshold adjusted n gate varactor element having an n type gate;
each threshold adjusted varactor element having:
   a body constructed out of a p type substrate, said body having:
      an n-well implanted in the body;
      a threshold implant for adjusting a threshold of the threshold adjusting varactor element;
      at least two n+ doped regions in the n-well;
   a gate insulator electrically isolating the gate from the n-well.

7. A varactor as claimed in claim 5 wherein the plurality of varactor elements includes threshold adjusted elements chosen from the group comprising:
   a threshold adjusted p gate varactor element having a p type gate; and
   a threshold adjusted n gate varactor element having an n type gate;
each threshold adjusted varactor element having:
   a body constructed our of an n type substrate said body having:
      a p-well implanted in the body;
      a threshold implant for adjusting a threshold of the threshold adjusting varactor element;
      at least two p+ doped regions in the p-well; and
   a gate insulator electronically isolating the gate from the p-well.

8. A varactor as claimed in claim 5 wherein the plurality of varactor elements includes threshold adjusted elements chosen from the group comprising:
   a threshold adjusted p gate varactor element having a p type gate; and
   a threshold adjusted n gate varactor element having an n type gate;
each threshold adjusted varactor element having:
   a body constructed out of a p type substrate, said body having;
      an n-well implanted in the body;
      at least two n+ doped regions in the n-well; a gate insulator electrically isolating the gate from the n-well; and a threshold adjusting voltage source coupled between the n+ regions and the voltage source.

9. A varactor as claimed in claim 5 wherein the plurality of varactor elements includes threshold adjusted elements chosen from the group comprising:
   a threshold adjusted p gate varactor element having a p type gate; and
   a threshold adjusted n gate varactor element having an n type gate;
and wherein each threshold adjusted varactor element has;
   a body constructed out of an n type substrate, said body having:
      a p-well implanted in the body;
      at least two p+ doped regions in the p-well;
   a gate insulator electronically isolating the gate from the p-well; and
   a threshold adjusting voltage source connected between the p+ regions and said voltage source.

10. A method of extending the voltage control range of a varactor while maintaining a high maximum to minimum capacitance ratio of the varactor, comprising:
   coupling in parallel at least one pair of varactor elements comprising:
      an n gate varactor element having an n type gate and doped regions;
      a p gate varactor element having a p type gate and doped regions;
      connecting said gates together and to an output;
      connecting doped regions of said varactor elements to a voltage source.

11. A method as claimed in claim 10 further including:
   coupling in parallel to said pair of varactor elements a pair of threshold adjusted varactor elements comprising:
      a threshold adjusted n gate varactor element having an n+ type gate; and
      a threshold adjusted p gate varactor element having a p+ type gate;
      connecting the pair of threshold adjusted varactor elements in parallel to each other.

12. A method as claimed in claim 11 further including adjusting a threshold voltage of a threshold adjusted varactor element by implanting a threshold adjust implant in a well of the threshold adjusted varactor.

13. A method as claimed in claim 11 including adjusting a threshold voltage of a threshold adjusted varactor element by coupling doped regions of a well of a threshold adjusted varactor element to a threshold adjusting voltage source.

* * * * *